(12) United States Patent
Tanisawa et al.

(10) Patent No.: US 10,461,050 B2
(45) Date of Patent: Oct. 29, 2019

(54) BONDING PAD STRUCTURE OF A SEMICONDUCTOR DEVICE

(71) Applicant: FUJI ELECTRIC CO., LTD., Kawasaki-shi, Kanagawa (JP)

(72) Inventors: Hidekazu Tanisawa, Tsukuba (JP); Shinji Sato, Tsukuba (JP); Fumiki Kato, Tsukuba (JP); Hiroshi Sato, Tsukuba (JP); Kenichi Koui, Tsukuba (JP); Hiroki Takahashi, Tsukuba (JP); Yoshinori Murakami, Yokohama (JP)

(73) Assignee: FUJI ELECTRIC CO., LTD., Kawasaki-shi, Kanagawa (JP)

( * ) Notice: Subject to any disclaimer, the term of this patent is extended or adjusted under 35 U.S.C. 154(b) by 0 days.

(21) Appl. No.: 15/788,435

(22) Filed: Oct. 19, 2017

(65) Prior Publication Data
US 2018/0114765 A1    Apr. 26, 2018

(30) Foreign Application Priority Data
Oct. 21, 2016    (JP) .................................. 2016-206964

(51) Int. Cl.
*H01L 29/40*    (2006.01)
*H01L 23/52*    (2006.01)
(Continued)

(52) U.S. Cl.
CPC ........ *H01L 24/10* (2013.01); *H01L 23/53219* (2013.01); *H01L 23/53233* (2013.01); *H01L 23/53247* (2013.01); *H01L 23/53261* (2013.01); *H01L 24/42* (2013.01); *H01L 24/85* (2013.01); *H01L 2224/05611* (2013.01); *H01L 2224/05644* (2013.01); *H01L 2224/45124* (2013.01);
(Continued)

(58) Field of Classification Search
CPC ............... H01L 24/10; H01L 23/53247; H01L 23/53219; H01L 23/53233; H01L 23/53261; H01L 24/42; H01L 2224/85205
See application file for complete search history.

(56) References Cited

U.S. PATENT DOCUMENTS 4,942,451 A * 7/1990 Tamaki ............... H01L 21/0274
    257/437
5,976,684 A * 11/1999 Oyama ................. C23C 14/022
    359/586
(Continued)

FOREIGN PATENT DOCUMENTS

JP    2004-140072 A    5/2004

*Primary Examiner* — Ismail A Muse
(74) *Attorney, Agent, or Firm* — Muncy, Geissler, Olds & Lowe, P.C.

(57) ABSTRACT

An object of the present invention is to stabilize and strengthen the strength of a bonding part between a metal electrode on a semiconductor chip and metal wiring connected thereto using a simple structure.
Provided is a semiconductor device including a metal layer 130 on a surface of a metal electrode 120 formed on a semiconductor chip 110, the metal layer 130 consisting of a metal or an alloy different from a constituent metal of the metal electrode 120, metal wiring 140 is connected to the metal layer 130 via a bonding part 150, wherein the constituent metal of the metal layer 130 is a metal or an alloy different from the constituent metal of the metal electrode 120, and the bonding part 150 has an alloy region harder than the metal wiring 140.

14 Claims, 7 Drawing Sheets

(51) Int. Cl.
*H01L 23/48* (2006.01)
*H01L 23/00* (2006.01)
*H01L 23/532* (2006.01)

(52) U.S. Cl.
CPC ............... *H01L 2224/45139* (2013.01); *H01L 2224/45144* (2013.01); *H01L 2224/45147* (2013.01); *H01L 2224/45565* (2013.01); *H01L 2224/4847* (2013.01); *H01L 2224/48472* (2013.01); *H01L 2224/85205* (2013.01)

(56) References Cited

U.S. PATENT DOCUMENTS

| | | | | |
|---|---|---|---|---|
| 6,507,112 B1* | 1/2003 | Kurihara | ................. | H01L 24/03 257/734 |
| 6,727,590 B2* | 4/2004 | Izumitani | ............ | H01L 23/5226 257/208 |
| 6,800,555 B2* | 10/2004 | Test | ....................... | H01L 21/288 438/687 |
| 7,528,489 B2* | 5/2009 | Kajiwara | ............ | H01L 23/3107 257/712 |
| 8,466,548 B2* | 6/2013 | Bayerer | .................. | H01L 23/15 257/703 |
| 9,153,555 B2* | 10/2015 | Lee | ......................... | H01L 24/03 |
| 9,960,130 B2* | 5/2018 | Huang | .................... | H01L 24/05 |
| 2001/0008311 A1* | 7/2001 | Harada | .................... | H01L 24/03 257/758 |
| 2003/0052339 A1* | 3/2003 | Harada | .................... | H01L 24/03 257/200 |
| 2003/0080428 A1* | 5/2003 | Izumitani | ............ | H01L 23/5226 257/758 |
| 2004/0089936 A1* | 5/2004 | Shizuno | ............. | H01L 23/49816 257/686 |
| 2005/0079651 A1* | 4/2005 | Gleixner | .................. | H01L 24/03 438/107 |
| 2006/0055309 A1* | 3/2006 | Ono | .................... | H01L 25/0753 313/492 |
| 2006/0144907 A1* | 7/2006 | Kadoguchi | .......... | B23K 20/005 228/180.5 |
| 2006/0151889 A1* | 7/2006 | Kajiwara | ............ | H01L 23/3107 257/787 |
| 2008/0006951 A1* | 1/2008 | Hebert | .................... | H01L 24/03 257/786 |
| 2009/0178830 A1* | 7/2009 | Seo | ......................... | H01L 24/48 174/257 |
| 2010/0028572 A1* | 2/2010 | Kobayashi | ............... | C03C 15/00 428/34.1 |
| 2012/0001336 A1* | 1/2012 | Zeng | ...................... | H01L 24/05 257/769 |
| 2012/0031755 A1* | 2/2012 | Guo | .................... | C23C 14/3464 204/298.09 |
| 2012/0153444 A1* | 6/2012 | Haga | .................... | H01L 23/4334 257/666 |
| 2013/0001777 A1* | 1/2013 | Veychard | ................. | H01L 24/03 257/738 |
| 2013/0196499 A1* | 8/2013 | Burgess | .................. | H01L 24/11 438/614 |
| 2013/0228907 A1* | 9/2013 | Nakajo | ................... | H01L 24/49 257/676 |
| 2014/0191391 A1* | 7/2014 | Chuang | .................. | H01L 24/81 257/737 |
| 2014/0264383 A1* | 9/2014 | Kajiwara | ............... | H01L 23/293 257/77 |
| 2014/0284797 A1* | 9/2014 | Hisazato | ........... | H01L 23/49866 257/741 |
| 2015/0200181 A1* | 7/2015 | Haga | .................... | B23K 20/005 438/127 |
| 2015/0287696 A1* | 10/2015 | Ueda | ....................... | H01L 24/29 438/107 |
| 2016/0155714 A1* | 6/2016 | Hilsenbeck | ............. | H01L 24/05 257/762 |
| 2016/0163806 A1* | 6/2016 | Nishimura | ........ | H01L 29/41741 257/331 |
| 2016/0268222 A1* | 9/2016 | Matsumoto | ............. | H01L 22/32 |
| 2016/0300827 A1* | 10/2016 | Vendt | .................. | H01L 27/0262 |
| 2016/0307865 A1* | 10/2016 | Qin | ......................... | H01L 24/05 |
| 2016/0358890 A1* | 12/2016 | Heinrich | ................. | H01L 24/16 |
| 2017/0034911 A1* | 2/2017 | Otsubo | .................. | H01L 23/145 |
| 2017/0053902 A1* | 2/2017 | Yu | ......................... | H01L 25/105 |
| 2017/0200691 A1* | 7/2017 | Fujino | .................... | H01L 24/48 |
| 2017/0338164 A1* | 11/2017 | Koerner | ................. | H01L 21/56 |
| 2018/0061731 A1* | 3/2018 | Val | ........................ | H01L 23/367 |
| 2018/0076117 A1* | 3/2018 | Hashizume | ......... | H01L 21/4842 |
| 2018/0076167 A1* | 3/2018 | Chuang | .................. | H01L 24/45 |

\* cited by examiner

BONDING PAD STRUCTURE OF A SEMICONDUCTOR DEVICE

TECHNICAL FIELD

The present invention relates to technology for improving bonding strength of metal wiring bonded such as using an ultrasonic bonding method to a metal electrode on a surface of a semiconductor element.

BACKGROUND ART

As a method of connecting a metal electrode on a surface of a semiconductor element and metal wiring such as a wire, there is a method of bonding metal wiring using an ultrasonic bonding method.

For example, Patent Literature 1 discloses an ultrasonic bonding method of vibrating a metal wire at a predetermined ultrasonic frequency while a predetermined load is applied using a dedicated jig in a state where a metal electrode on a surface of a semiconductor element and an end portion of the metal wire are in contact with each other. This is to generate local frictional heat in the contacting part in a short time and to melt the metals to be bonded together. The other end of the metal wire is similarly bonded to another electrode or the like included in a structure in which the semiconductor element is mounted.

CITATION LIST

Patent Literature

[Patent Literature 1] JP 2004-140072 A

SUMMARY OF INVENTION

Technical Problem

In such a connection structure as described above, when the temperature of the use environment changes, stress is generated in a bonding part using ultrasonic bonding method due to a difference between coefficient of thermal expansion of a semiconductor chip and that of a metal wire. In addition, even though the bonding part seems to be bonded uniformly at a glance, there is dispersion in the bonding strength in a bonding surface of the bonding part. Therefore, when large temperature changes are repeatedly caused, separation progresses gradually from a portion with weak bonding strength in the bonding surface.

Even in an environment in which a temperature change occurs, as long as the temperature change is within a predetermined range, it is possible to design a bonding part such that the bonding part can withstand the more number of times of stress load against the number of repetitions of temperature changes that leads to complete separation and disconnection of the bonding between the semiconductor chip and the metal wire. However, in a case where a temperature range in which a semiconductor device can operate is wider than the conventional temperature range such as that the type of the semiconductor chip has changed, such a connection structure results in either that the number of temperature cycles with which the bonding of the connection (bonding part) can be maintained decreases or that an upper limit is provided to a temperature range in which a predetermined number of temperature cycles can be secured.

The present invention has been devised in order to solve the above disadvantages. The present invention provides a connection structure of a semiconductor device capable of stably and firmly bonding a bonding part between a metal electrode of a semiconductor chip and metal wiring using a simple structure.

Solution to Problem

A semiconductor device according to the present invention includes: a semiconductor chip; a metal electrode formed on a surface of the semiconductor chip; a metal layer formed on a surface of the metal electrode opposite to the semiconductor chip; a bonding part; and metal wiring connected to the metal layer via the bonding part, in which a constituent metal of the metal layer is a metal or an alloy different from a constituent metal of the metal electrode, and the bonding part has an alloy region harder than the metal wiring.

Moreover, a semiconductor device according to the present invention includes: a semiconductor chip; a metal electrode formed on a surface of the semiconductor chip; a bonding part; and metal wiring connected to the metal electrode via the bonding part, in which the metal wiring is covered with a metal layer consisting of a metal or an alloy different from a constituent metal of the metal electrode, and the bonding part has an alloy region harder than the metal wiring.

With such a configuration, in the semiconductor device according to the present invention, the bonding part is formed by arranging the metal layer between the metal electrode of the semiconductor chip and the metal wiring. Therefore, the hardness of the bonding part can be higher than that of the metal wiring, and thus it is possible to bond together the semiconductor chip and the metal wiring stably and firmly. As a result, even if the range of repeated temperature changes is broadened, the enough number of cycles before reaching disconnection can be ensured.

Furthermore, in the above invention, the metal layer may be an alloy mainly/essentially consisting of Zn and Al, and the metal wiring may be one of Ag, Al, Au, Cu, and an alloy mainly/essentially consisting of Ag, Al, Au, and Cu. Furthermore, the metal layer may be an alloy mainly/essentially consisting of Au, and the metal wiring may be one of Al, Cu, and an alloy mainly/essentially consisting of one of Al and Cu. Alternatively, the metal layer may be Sn or an alloy mainly/essentially consisting of Sn, and the metal wiring may be one of Ag, Au, Cu, and an alloy mainly/essentially consisting of Ag, Au, and Cu.

With such a configuration, components of a constituent alloy of the bonding part are more optimized. Thus, the semiconductor chip and the metal wiring can be bonded more stably and firmly.

DESCRIPTION OF EMBODIMENTS

Hereinafter, a semiconductor device according to the first embodiment of the present invention will be described with reference to FIGS. 1 to 9.

Figure 1:
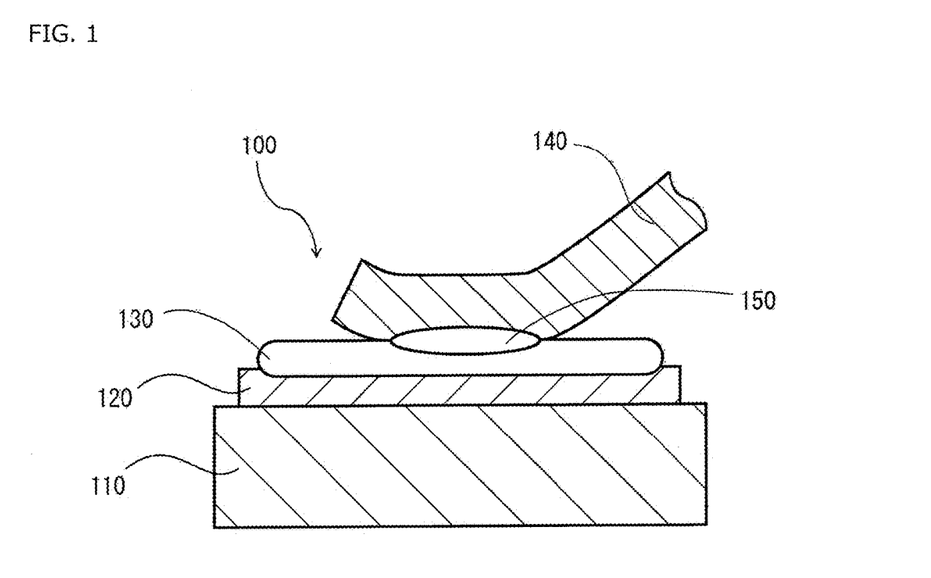
FIG. 1 is a cross-sectional view showing a bonding structure of a semiconductor device according to a first embodiment of the present invention.

FIG. 1 is a cross-sectional view showing a bonding structure of a semiconductor device 100 according to the first embodiment of the present invention. In FIG. 1, symbol 110 denotes a semiconductor chip, and symbol 120 denotes a metal electrode formed on the semiconductor chip 110. The metal electrode here is Al, Cu, or Ni. Symbol 130 denotes a metal layer formed on a surface of the metal electrode 120. The metal layer here consists of an AlZn alloy. A component denoted by symbol 140 and bonded to the metal layer 130 is metal wiring made of Al and having a wire shape. At a bonding interface between the metal layer 130 and the metal wiring 140, a bonding part 150 made of an alloy of the metal layer 130 and the metal wiring 140 is formed.

Figure 2:
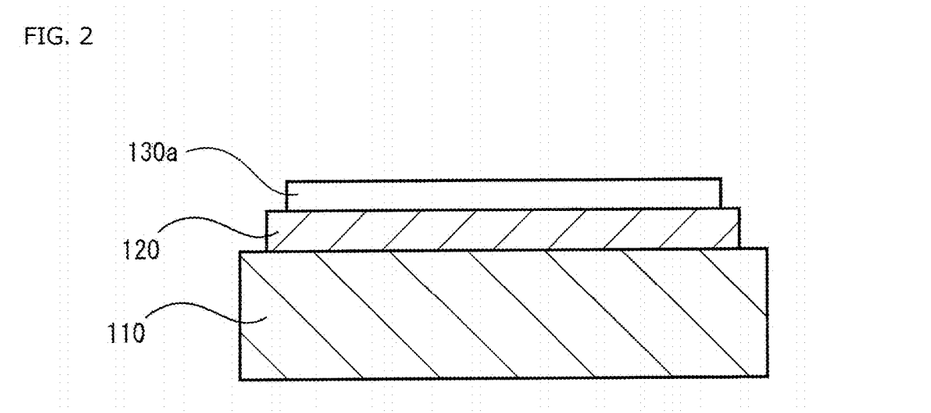
FIG. 2 is a cross-sectional view showing a bonding process of the bonding structure illustrated in FIG. 1.

Here, a bonding process of the bonding structure of the semiconductor device 100 illustrated in FIG. 1 will be described. First, as illustrated in FIG. 2, a metal layer 130a made of Zn is laminated on the metal electrode 120 made of Al formed on the semiconductor chip 110 to form a laminated structure. Methods for forming the metal layer 130a include partial plating and partial vapor deposition. Alternatively, a metal thin plate 130a made of an AlZn alloy may be arranged at an appropriate region on the metal electrode 120.

Figure 3:
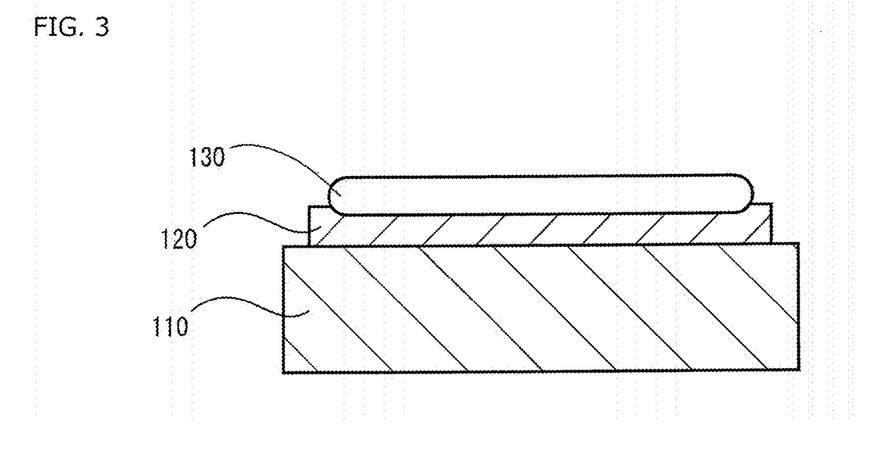
FIG. 3 is a cross-sectional view showing a bonding process of the bonding structure illustrated in FIG. 1.

Next, this laminated structure is heated to 419° C. (that is, the melting point of Zn) or higher. This results in formation of a eutectic alloy of Zn and Al, in which Al is mixed in the Zn layer at a ratio from 2.4 at % to 33 at % as illustrated in FIG. 3. Note that a heating temperature is more preferably within a range from the eutectic point (382° C.) of the AlZn alloy to 460° C. A high bonding strength can be obtained in the above temperature range. Heating time is preferably 1 minute to 10 minutes. Furthermore, at the time of the process in FIG. 2, an Ag thin film, an Au thin film or the like may be formed in advance on the surface of the metal electrode 120 for the purpose of preventing oxidation or other purposes. In such a case, the thin film made of Ag or Au in the portion of the surface of the metal electrode 120 in contact with the metal layer 130 disappears when the state illustrated in FIG. 3 is reached by heating.

Figure 4:
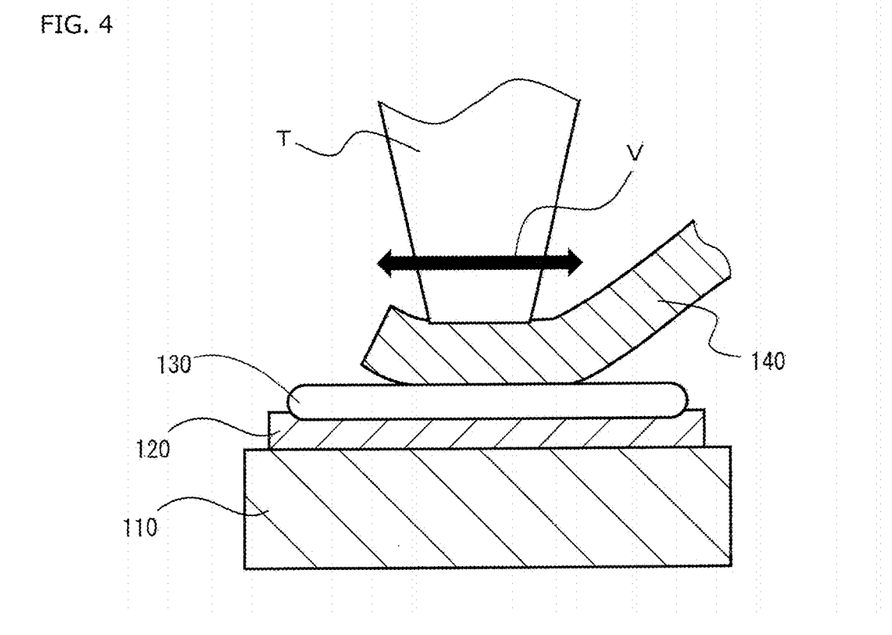
FIG. 4 is a cross-sectional view showing a bonding process of the bonding structure illustrated in FIG. 1.

Next, as illustrated in FIG. 4, the metal wiring 140 is ultrasonically bonded on the metal layer 130 using a dedicated tool T to form a bonding structure. At this point, the bonding strength in a bonding surface of the bonding part has microscopic dispersion. Subsequently, this bonding structure is heated to 419° C. or higher. This results in that the bonding interface of the bonding part 150, including the metal wiring 140 side, becomes a liquid phase. As a result, the bonding interface having the bonding strength dispersion disappears. Thereafter, returning to a room temperature and solidifying forms the bonding part 150 illustrated in FIG. 1.

Because the bonding part 150 formed through the bonding process as illustrated FIGS. 2 to 4 contains the eutectic alloy described above, the hardness thereof is higher than that of the Al metal wiring 140. This leads to increase a tolerance of the alloy region against a thermal stress. An oxide film is formed on a surface of the AlZn alloy at this time. Even if this alloy turns into a liquid phase, breakage of the oxide film does not easily occur. However, in the region bonded by the ultrasonic bonding method, the oxide film is broken by ultrasonic vibration and metal atoms are bonded to each other. Therefore, an alloying reaction proceeds selectively only in this portion.

Figure 5A:
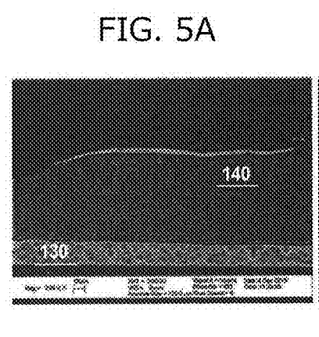
FIGS. 5A and 5B are SEM photographs of the vicinity of the bonding structure illustrated in FIG. 1.
Figure 5B:
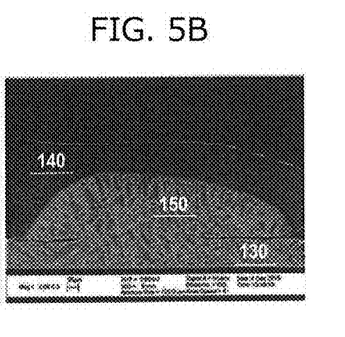

FIGS. 5A and 5B illustrate SEM photographs showing the vicinity of the bonding structure illustrated in FIG. 1. FIG. 5A illustrates a state before heating. When a bonding interface is carefully observed, a bonded region and a region having a void are observed. FIG. 5B illustrates a state after heating. As apparently illustrated, the bonding part 150 is formed over the inside of the metal wiring 140 due to an alloying reaction resulted from melting by heat and re-solidifying. Because the hardness of the bonding part 150 is higher than that of the metal wiring 140, high connection reliability can be secured even if a thermal stress is applied to the bonding interface of the bonding part 150 due to a sudden temperature change.

Figure 6:
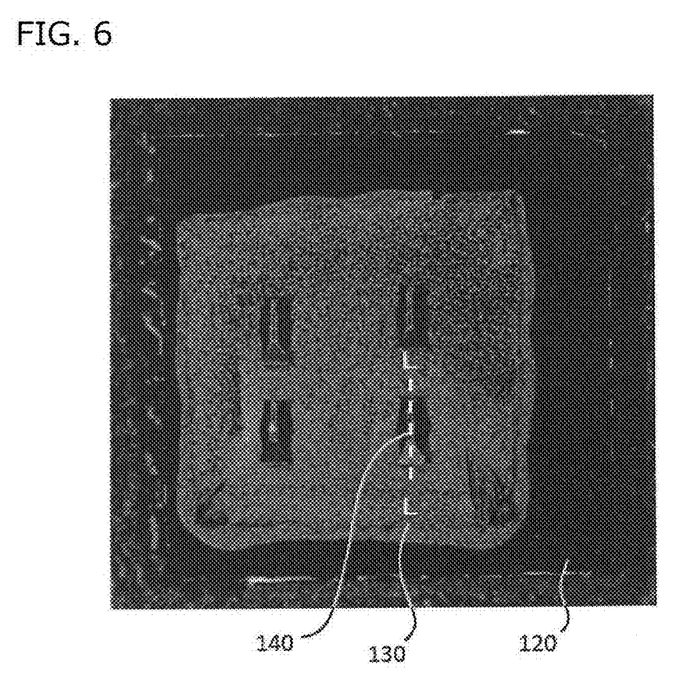
FIG. 6 is a photograph of a front view of a sample of the bonding structure according to the first embodiment of the present invention.

Next, a result of examining the bonding strength of a bonding structure in a sample of the semiconductor device according to the first embodiment of the present invention will be described. FIG. 6 is a photograph of a front view of the sample of the bonding structure according to the first embodiment. Symbols in FIG. 6 are the same as those used in FIGS. 1 to 4. In the sample, a metal layer 130 was formed by placing a small piece 130a of an AlZn alloy having a thickness of several tens of micrometers on the metal electrode 120 mainly/essentially consisting of Al and melting the small piece once to bond them together. Then, an Al wire was bonded to an upper surface thereof by the ultrasonic bonding method, and wires other than the bonding part were cut and removed to form four pieces of metal wiring 140 as illustrated in FIG. 6, which were then subjected to a shear strength test. Here, in the shear strength test, a load at the time when each of the pieces of metal wiring 140 in FIG. 6 was pushed laterally and broken was measured. Note that a cross section taken along a line segment L-L drawn on the metal wiring 140 on the lower right in FIG. 6 corresponds to FIGS. 5A and 5B described above.

Figure 7A:
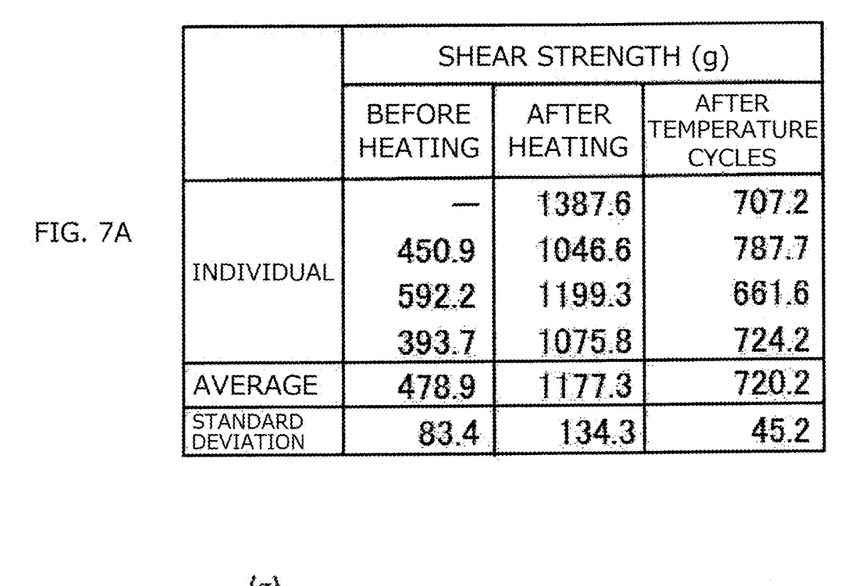
FIGS. 7A and 7B are a table and a graph, respectively, illustrating a result of a shear strength test of metal wiring of the sample illustrated in FIG. 6.
Figure 7B:
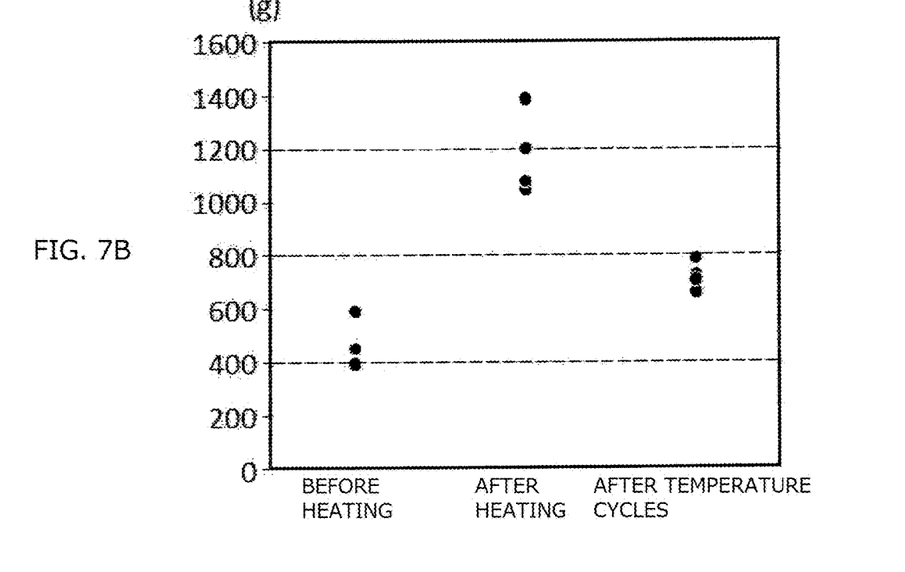

FIGS. 7A and 7B are a table and a graph, respectively, illustrating a result of the shear strength test of the metal wiring of the sample illustrated in FIG. 6. The shear strength test is performed at three levels including: a state before heating the bonding part; a state after heating; and a state after subjecting a heated sample to 1000 cycles between −40° C. and +250° C. (hereinafter referred to as "after temperature cycles"). Note that, in the sample before heating, one point could not be measured and evaluation was made only by three points.

As apparent from FIG. 7A, in the sample before heating and only subjected to ultrasonic bonding of an Al wire, the shear strength was 479 g on the average, whereas in the sample after heating in which an alloy is formed, the average value was improved to 1177 g. After experiencing the temperature cycles, a stress is repeatedly applied to a bonding region due to a difference in coefficients of thermal expansion of the respective members, and the bonding strength decreases. Here, although the average value of shear strength decreased to 720 g after the temperature cycles even in the sample after heating, this is a higher value than the shear strength of the sample before heating, which can be regarded as the strength almost equivalent to that according to the conventional art. Therefore, the effect of the bonding structure of the present invention can be clearly confirmed.

Note that the embodiment described above illustrates the example where the Al wire is used as the metal wiring 140; however, a similar structure can be implemented even when the metal wiring 140 consists of Cu or an alloy mainly/essentially consisting of Cu. Generally, when Cu is mixed in an Al—Zn alloy system, the liquidus temperature decreases, and Cu dissolves proactively in the liquid phase Al—Zn alloy. Thus, the bonding part 150 is alloyed like in the above embodiment.

The metal layer 130 may be a metal mainly/essentially consisting of Au such as an AuGe alloy, and the metal electrode 120 and the metal wiring 140 may be selected from group consisting of Al, Cu, and an alloy mainly/essentially consisting of these. Alternatively, the metal layer 130 may be an alloy mainly/essentially consisting of Sn (for example, Sn—Ag—Cu based (SAC) solder), and the metal electrode 120 and the metal wiring 140 may be selected from group consisting of Ag, Au, Cu and an alloy mainly/essentially consisting of these. For example, in the case where the metal layer 130 is an SAC solder, when such a bonding structure is heated to about 230° C. (that is, the melting point of Sn) after ultrasonic bonding, Sn is turned into a liquid phase but then soon form an intermetallic compound with a metal of the metal wiring 140, and a solidus line rises. Therefore, Sn in the liquid phase disappears at the applied temperature, and the bonding part 150 is alloyed. These intermetallic compounds generally have a high hardness to improve the reliability of the bonding part 150. Note that a heating temperature is more preferably 230° C.±30° C.

Figure 8A:
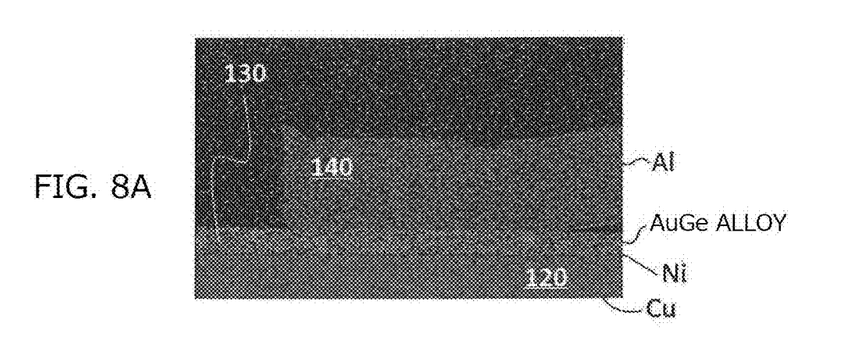
FIGS. 8A and 8B are EDX images of the vicinity of a bonding structure according to a modification of the first embodiment of the present invention.
Figure 8B:
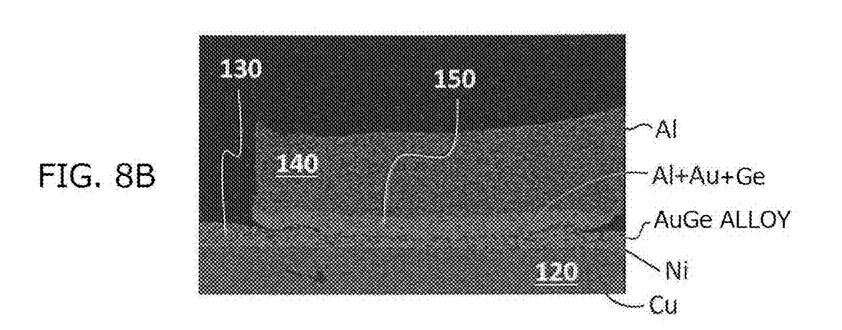

FIGS. 8A and 8B are EDX images of a sample in which the metal layer 130 consists of an AuGe alloy and the metal wiring 140 consists of Al. FIG. 8A illustrates a state after ultrasonic bonding and before heating. No alloy region was observed between the metal layer 130 and the metal wiring 140. On the other hand, FIG. 8B illustrates a state after heating, in which an alloyed bonding part 150 consisting of Al, Au, and Ge was formed. Note that a heating temperature is more preferably 356° C.±50° C., which is the eutectic point of the AuGe alloy.

Figure 9:
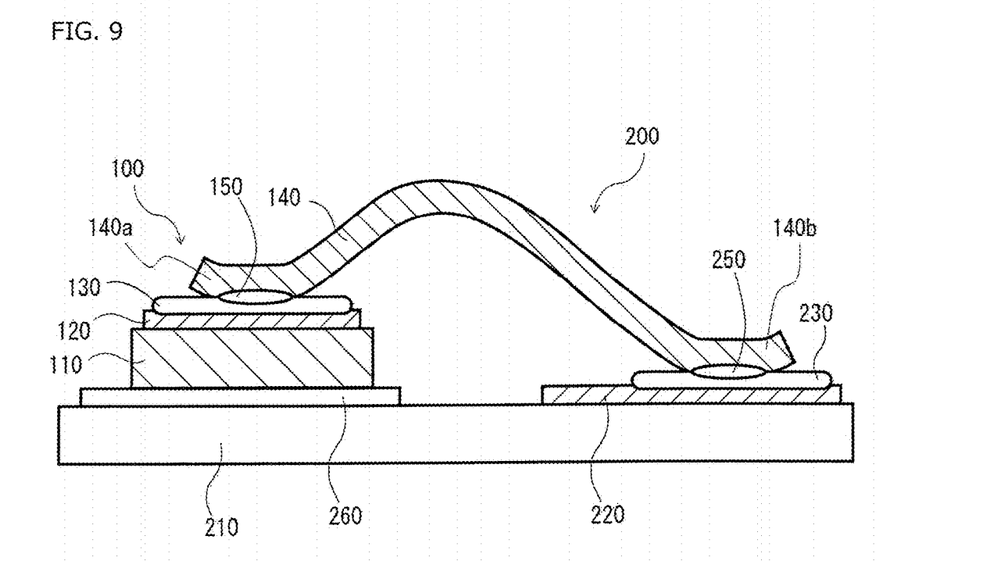
FIG. 9 is a cross-sectional view showing an exemplary mounting structure of a semiconductor device according to the first embodiment of the present invention.

FIG. 9 is a cross-sectional view illustrating an example of a mounting structure 200 to which the semiconductor device 100 according to the first embodiment of the present invention is applied. As illustrated in FIG. 9, the semiconductor device 100 illustrated in FIG. 1 is mounted on a substrate 210 made of an insulator or the like via an adhesion layer 260. Meanwhile, a metal electrode 220 is formed on another portion of the upper surface of the substrate 210. The metal electrode 220 is connected to an external terminal (not illustrated) of this mounting structure and exchanges electric current and/or electric signals with other external devices.

In FIG. 9, one end 140*a* of the metal wiring 140 of the semiconductor device 100 is bonded to the metal electrode 120 via the metal layer 130. Another end 140*b* of the metal wiring 140 is bonded to the metal electrode 220 via a metal layer 230 similar to the metal layer 130. At this time, a bonding part 250 is formed between the metal wiring 140 and the metal layer 230 by an ultrasonic bonding method. This allows a bonding interface of the bonding part 250 to be alloyed and to improve bonding reliability.

Next, a semiconductor device according to the second embodiment of the present invention will be described with reference to FIG. 10.

Figure 10:
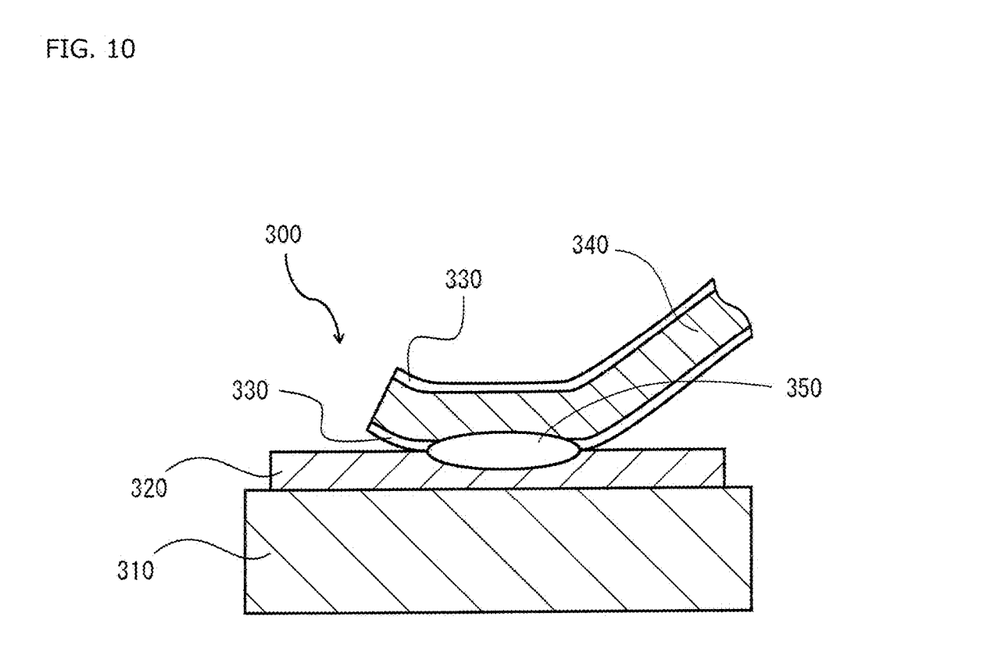
FIG. 10 is a cross-sectional view showing a bonding structure of a semiconductor device according to a second embodiment of the present invention.

FIG. 10 is a cross-sectional view showing a bonding structure of a semiconductor device 300 according to the second embodiment of the present invention. In this bonding structure, instead of providing the metal layer on the metal electrode 320 formed on the upper surface of the semiconductor chip 310, the outer surface of the metal wire 340 is covered with a metal layer 330 in advance. In such a combination, the metal wire 340 covered with the metal layer 330 is ultrasonically bonded to the upper surface of the metal electrode 320 in a similar manner to that of the first embodiment and a bonding part 350 is heated to a predetermined temperature to be alloyed. The alloyed bonding part 350 has a hardness higher than that of the metal wire. Thus, a similar effect to that of the case of the first embodiment is obtained.

According to such a configuration, a structure with high connection reliability can be implemented by using the metal wire 340 covered with the metal layer 330 without performing the pretreatment of disposing the metal layer 330 on the metal electrode 320 of the semiconductor chip 310 in advance. Note that, also in this bonding structure, combinations of metals exemplified above can be used.

Next, a semiconductor device according to the third embodiment of the present invention will be described with reference to FIG. 11.

Figure 11:
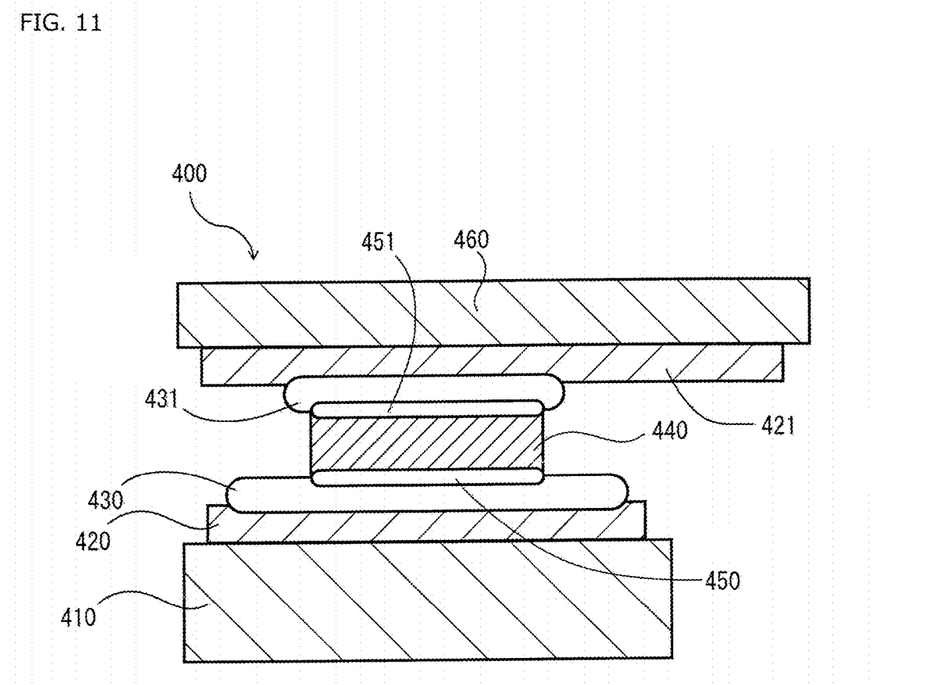
FIG. 11 is a cross-sectional view showing a bonding structure of the semiconductor device according to a third embodiment of the present invention.

FIG. 11 is a cross-sectional view showing a bonding structure 400 of the semiconductor device according to the third embodiment of the present invention. In this bonding structure, a bump 440 is used instead of the metal wiring 140 used in the first embodiment. Furthermore, an insulating plate 460 formed with a metal electrode 421 is arranged at a position facing a semiconductor chip 410. Note that the metal electrode 421 is connected to an external terminal of this bonding structure (not illustrated) and is configured to exchange electric current and/or signals with other external devices.

A metal electrode 420 is formed on the semiconductor chip 410 illustrated in FIG. 11, and the bump 440 is bonded to the metal electrode 420 via a metal layer 430. At this time, like in the first embodiment, a bonding part 450 alloyed by heating after ultrasonic bonding is formed between the metal layer 430 and the bump 440. Meanwhile, other surface of the bump 440 is bonded to the metal electrode 421 formed on the insulating plate 460 via a metal layer 431. A bonding part 451 alloyed by heating after ultrasonic bonding is likewise formed between the metal layer 431 and the bump 440.

According to such a configuration, the metal electrode 420 of the semiconductor chip 410 and the metal electrode 421 of the insulating plate 460 are bonded via the bump 440. This results in saving the space and facilitating positioning. In addition, because the alloyed bonding parts 450 and 451 having a higher hardness than that of the bump 440 are formed between the bump 440 and the metal electrodes 420 and 421, high connection reliability can be ensured even after exposure of the temperature cycles.

Although specific embodiments of the semiconductor device according to the present invention and modifications based thereon have been described above, the present invention is not necessarily limited thereto, and other structures are also within the scope of the present invention as long as they meet the scope of claims of the present invention.

REFERENCE SIGNS LIST 100, 300 Semiconductor device
110, 310, 410 Semiconductor chip
120, 220, 320, 420, 421 Metal electrode
130, 230, 330, 430, 431 Metal layer
140, 340, 440 Metal wiring
150, 250, 350, 450, 451 Bonding part
200, 400 Mounting structure
210, 460 Insulator (substrate), insulating plate

What is claimed is:

1. A semiconductor device comprising:
a semiconductor chip;
a metal electrode formed on a surface of the semiconductor chip; and
metal wiring connected to the metal electrode via a bonding part,
wherein an outer peripheral of the metal wiring is covered with a metal layer consisting of a metal or an alloy different from a constituent metal of the metal electrode,
the bonding part has an alloy region harder than the metal wiring, and
the metal layer is formed on an upper surface and a lower surface of at least the metal wiring, and a part of the lower surface contacts the bonding part.

2. The semiconductor device according to claim 1,
wherein the metal layer is an alloy essentially consisting of Zn and Al, and
the metal wiring is one of Ag, Al, Au, Cu, and an alloy essentially consisting of one of Ag, Al, Au, and Cu.

3. The semiconductor device according to claim 1,
wherein the metal layer is an alloy essentially consisting of Au, and
the metal wiring is one of Al, Cu, and an alloy essentially consisting of Al and Cu.

4. The semiconductor device according to claim 1,
wherein the metal layer is one of Sn and an alloy essentially consisting of Sn, and
the metal wiring is one of Ag, Au, Cu, and an alloy essentially consisting of one of Ag, Au, and Cu.

5. The semiconductor device according to claim 1, wherein
a flat region is formed on the metal wiring that is covered by the metal layer, the flat region being positioned at a side opposite from the bonding part,
a longitudinal length of the flat region, which is determined in a wiring direction along which the metal wiring extends, is the same as a length of the bonding part, which is determined in the wiring direction.

6. The semiconductor device according to claim 5, wherein
the flat region is shaped while the bonding part is formed by ultrasonic being applied to the metal wiring.

7. A semiconductor device comprising:
a semiconductor chip;
a metal electrode formed on a surface of the semiconductor chip, the metal electrode being formed of a constituent metal;
a metal layer formed on a surface of the metal electrode opposite to the semiconductor chip; and
metal wiring connected to the metal layer via a bonding part such that the boding part is disposed on a surface of the metal layer and intervenes between the metal layer and the metal wiring,
wherein the metal layer is either
made of Sn, or
an alloy essentially consisting of Sn,
the metal wiring is either
made of one of Ag and Cu or
an alloy essentially consisting of one of Ag and Cu,
the bonding part has an alloy region harder than the metal wiring,
defining a first interface that is between the metal layer and the bonding part, the first interface invades the metal layer by penetrating toward the metal layer from the surface of the metal layer, and
defining a second interface that is between the bonding part and the metal wiring, the second interface invades the metal wiring by penetrating toward the metal wiring from the surface of the metal layer.

8. The semiconductor device according to claim 7, wherein
a flat region is formed on the metal wiring, the flat region being positioned at a side opposite from the bonding part,
a longitudinal length of the flat region, which is determined in a wiring direction along which the metal wiring extends, is substantially the same as a length of the bonding part, which is determined in the wiring direction.

9. The semiconductor device according to claim 8, wherein
the flat region is shaped while the bonding part is formed by ultrasonic being applied to the metal wiring.

10. A semiconductor device comprising:
a semiconductor chip;
a metal electrode formed on a surface of the semiconductor chip; and
metal wiring connected to the metal electrode via a bonding part,
wherein an outer peripheral of the metal wiring is covered with a metal layer consisting of a metal or an alloy different from a constituent metal of the metal electrode,
the bonding part has an alloy region harder than the metal wiring,
the bonding part contacts the metal electrode and the metal wiring,
a flat region is formed on the metal wiring that is covered by the metal layer, the flat region being positioned at a side opposite from the bonding part, and
a longitudinal length of the flat region, which is determined in a wiring direction along which the metal wiring extends, is the same as a length of the bonding part, which is determined in the wiring direction.

11. The semiconductor device according to claim 10,
wherein the metal layer is an alloy essentially consisting of Zn and Al, and
the metal wiring is one of Ag, Al, Au, Cu, and an alloy essentially consisting of one of Ag, Al, Au, and Cu.

12. The semiconductor device according to claim 10,
wherein the metal layer is an alloy essentially consisting of Au, and
the metal wiring is one of Al, Cu, and an alloy essentially consisting of Al and Cu.

13. The semiconductor device according to claim 10,
wherein the metal layer is one of Sn and an alloy essentially consisting of Sn, and the metal wiring is one of Ag, Au, Cu, and an alloy essentially consisting of one of Ag, Au, and Cu.

14. The semiconductor device according to claim 10, wherein
the flat region is shaped while the bonding part is formed by ultrasonic being applied to the metal wiring.

\* \* \* \* \*